United States Patent [19]
Balyasny

[11] Patent Number: 5,497,104
[45] Date of Patent: Mar. 5, 1996

[54] FLEXIBLE INTERFACE IC TEST CLIP

[75] Inventor: Marik Balyasny, Burbank, Calif.

[73] Assignee: ITT Corporation, New York, N.Y.

[21] Appl. No.: 305,531

[22] Filed: Sep. 13, 1994

Related U.S. Application Data

[63] Continuation-in-part of Ser. No. 893,181, Jun. 3, 1992, abandoned.

[51] Int. Cl.⁶ .......................... G01R 1/073; H01R 23/72
[52] U.S. Cl. ............................................ 324/755; 439/912
[58] Field of Search .................................. 324/755, 754, 324/762, 758; 439/68, 70, 482, 912

[56] References Cited

U.S. PATENT DOCUMENTS

| | | | |
|---|---|---|---|
| 4,085,502 | 4/1978 | Ostman et al. | 29/629 |
| 4,357,750 | 11/1982 | Ostman | 29/847 |
| 4,471,158 | 9/1984 | Roberts | 174/52 |
| 4,473,798 | 9/1984 | Cedrone et al. | 324/158 |
| 4,508,402 | 4/1985 | Tomino et al. | 339/17 |
| 4,541,676 | 9/1985 | Hansen et al. | 339/17 |
| 4,554,505 | 11/1985 | Zachry | 324/158 |
| 4,574,235 | 3/1986 | Kelly et al. | 324/158 |
| 4,583,800 | 4/1986 | Roberts et al. | 339/17 |
| 4,671,590 | 6/1987 | Ignasiak | 439/266 |
| 4,689,556 | 8/1987 | Cedrone | 324/158 |
| 4,740,867 | 4/1988 | Roberts et al. | 361/398 |
| 4,749,362 | 6/1988 | Hoffman et al. | 439/269 |
| 4,768,972 | 9/1988 | Ignasiak et al. | 439/330 |
| 4,824,379 | 4/1989 | Roberts et al. | 439/77 |
| 4,996,476 | 2/1991 | Balyasny et al. | 324/158 |
| 5,042,971 | 8/1991 | Ambrose | 439/77 |
| 5,049,813 | 9/1991 | Van Loan et al. | 324/158 |
| 5,087,877 | 2/1992 | Frentz et al. | 324/158 |
| 5,277,622 | 1/1994 | Liljenberg et al. | 439/499 |

FOREIGN PATENT DOCUMENTS 3-69131  3/1991  Japan.

OTHER PUBLICATIONS

12 Sheets of various Advanced Circuit Technology sales bulletins/catalogs received by Applicant during years 1990–1991.

Primary Examiner—Ernest F. Karlsen
Attorney, Agent, or Firm—Freilich Hornbaker Rosen

[57] ABSTRACT

A test clip is provided, of the type that has multiple contacts that engage the leads of an IC (integrated circuit) device with closely spaced leads, which can be constructed reliably and at low cost. The test clip includes a flat flexible cable (52, FIG. 5) mounted on the clip housing (30), the cable having parallel conductors mounted on an insulative layer. The lower ends (58) of the conductors serve as lead-engaging contacts, and have exposed inner surfaces that directly engage largely vertical parts (60) of the IC device leads. A stiffener (70) formed by a sheet of stiff but flexible material, is attached to the lower portion of the cable on its outer surface, the stiffener having a lower portion that biases the lower ends of the conductors towards the leads. A circuit board (40) is mounted on the clip housing to lie in a horizontal plane, and has contact pads (80) on its lower surface. The flexible cable is bent so its upper end extends horizontally and has exposed upper conductor ends (92) that connect to the pads on the lower surface of the circuit board, the pads being connected to contact elements (36) of connectors on the upper surface of the circuit board.

8 Claims, 5 Drawing Sheets

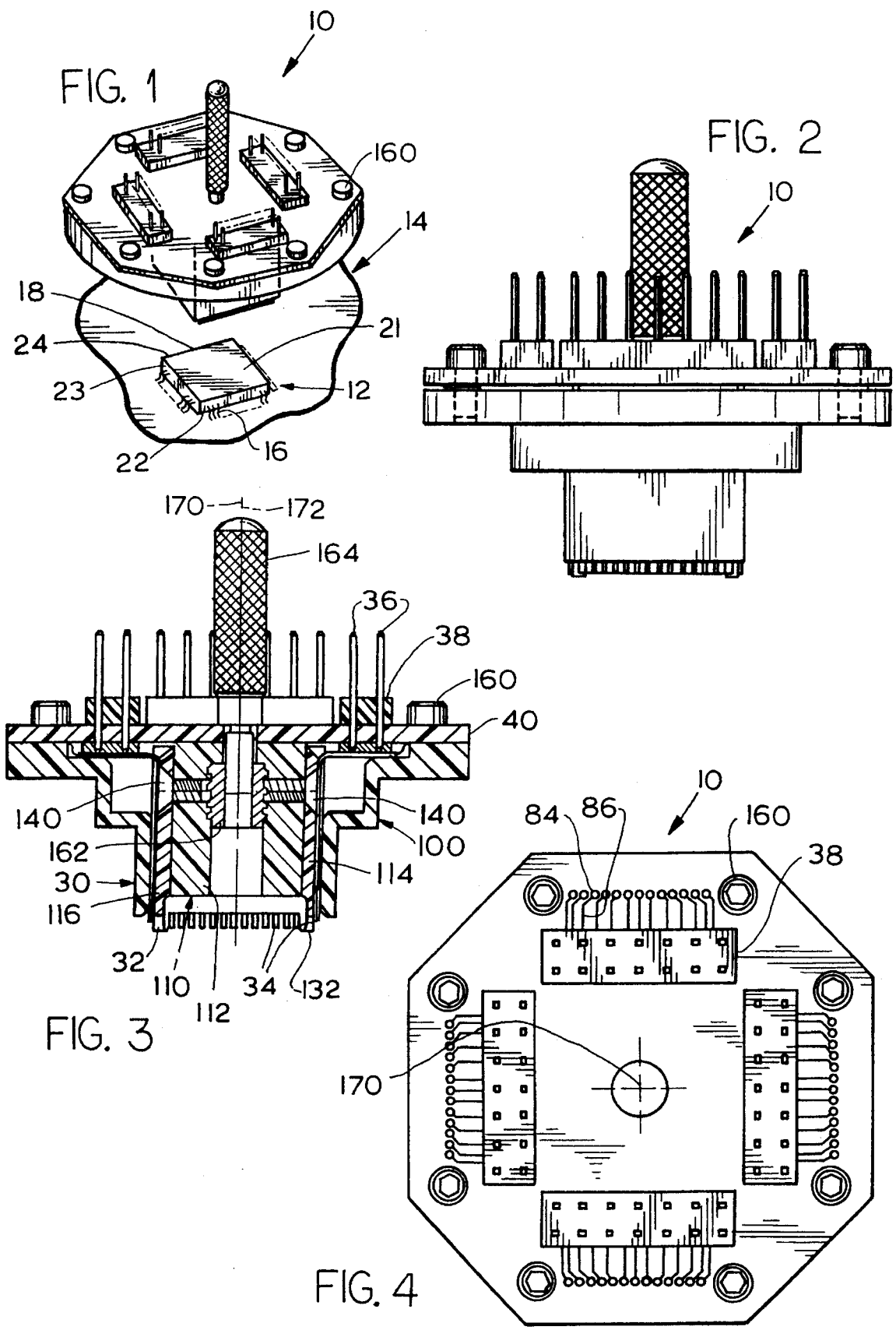

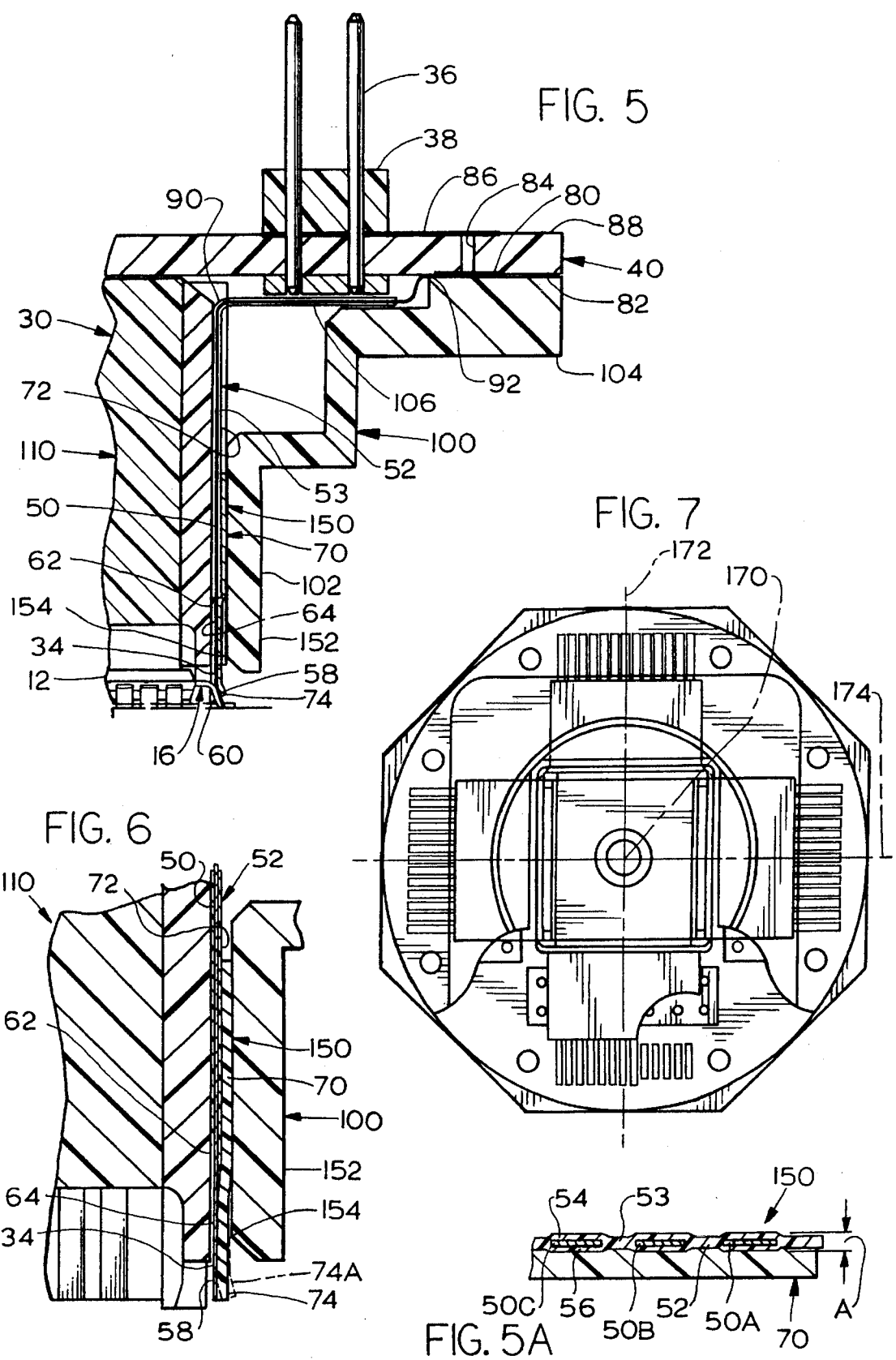

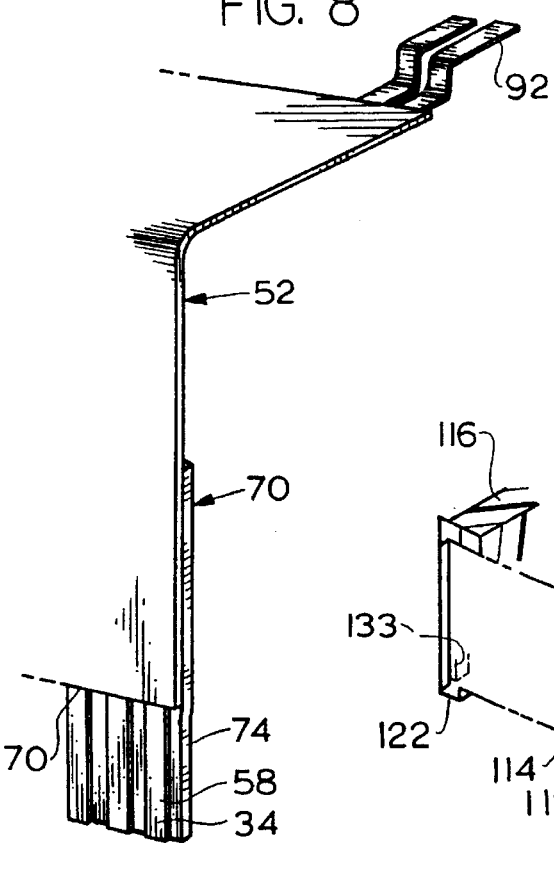
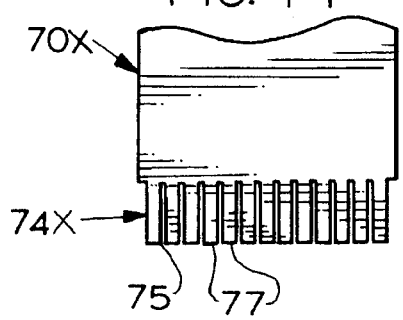
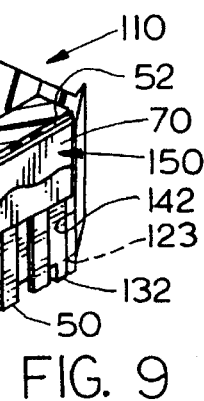
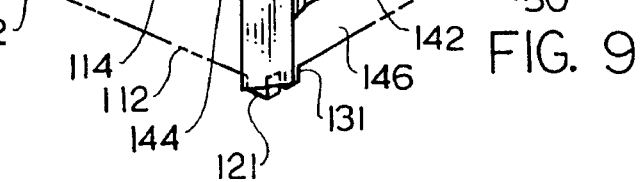
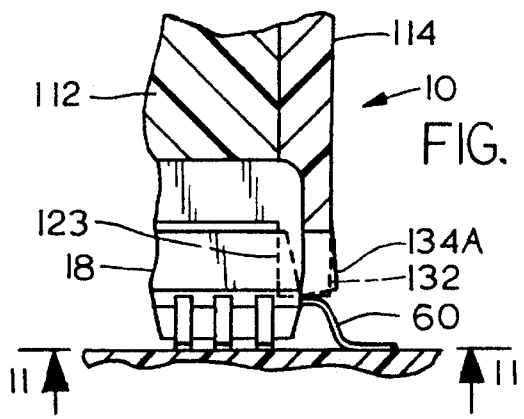
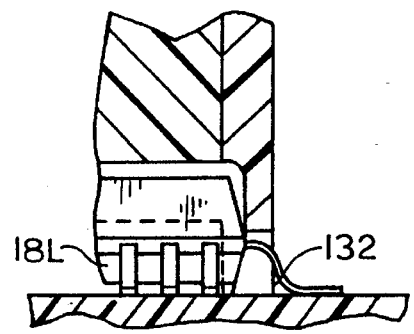
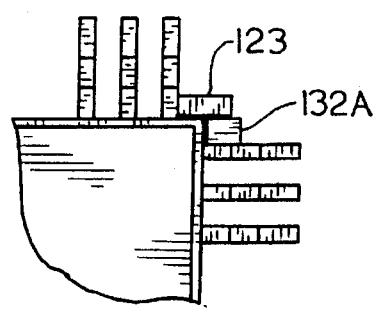
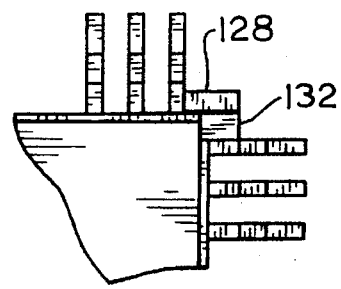

5,497,104

1

FLEXIBLE INTERFACE IC TEST CLIP

CROSS REFERENCE TO RELATED CASE

This is a Continuation-in-Part of patent application Ser. No. 07/893,181, filed Jun. 3, 1982, now abandoned.

BACKGROUND OF THE INVENTION

Test clips are used to temporarily connect to the leads of IC (integrated circuit) devices. High density circuits are generally in the form of flat packages having a rectangular body and multiple leads extending from two or four sides of the body to the circuit board. Present test clip used rows of individual contacts, each stamped or photo-fabricated to small tolerances. Each contact is placed in an individual slot of a plastic housing which separates adjacent contacts by thin barriers.

IC devices are becoming available with greater number of leads, with the pitch size, or distance between the centers of adjacent leads, becoming increasingly smaller. Such smaller IC devices enable the production of smaller sophisticated electronic devices. IC devices are currently available with fifty leads on each of four sides, having a 0.5 mm (0.02 inch) lead pitch side and it is expected that IC devices will soon be available with lead pitch sizes of 0.4 mm and 0.3 mm. As the pitch size decreases, the size and tolerances of the very thin contacts and of the insulator barrier walls between adjacent contacts, becomes extremely small. There is a question as to whether present technology can be used to produce reliable test clips for such IC devices even at high prices. The problem is compounded by the fact that existing IC devices as well as recently announced new ones are not well standardized. A test clip which could be manufactured at moderate cost to reliably engage the leads of IC devices having leads spaced at very small pitch sizes, would be of considerable value in the testing of IC circuit devices.

SUMMARY OF THE INVENTION

In accordance with one embodiment of the present invention, a test clip is provided which can be used with integrated circuit devices having leads spaced at a fine pitch, and which can be constructed at moderate cost. Lead-engaging contacts are formed by the conductors of a flat flexible cable which is mounted on the housing of the test clip. The cable conductors have lower ends with inner surfaces that are exposed to enable them to directly engage the leads of the IC device. A stiffener formed of a sheet of resilient material is attached to a lower portion of the cable at the outer side of the conductor lower ends. The stiffener resiliently biases the conductor lower ends against the leads of the IC device. A circuit board is mounted on the clip housing to lie in a horizontal plane, and has a lower surface with a row of conductive pads. The cable is bent so its upper end lies under the circuit board, with the upper ends of the conductors having upper surfaces that are exposed and which engage the conductive pads on the circuit board.

The novel features of the invention are set forth with particularity in the appended claims. The invention will be best understood from the following description when read in conjunction with the accompanying drawings.

BRIEF DESCRIPTION OF THE DRAWINGS

FIG. 1 is a simplified isometric view of a test clip constructed in accordance with the present invention, and showing it lying above an integrated circuit device that is mounted on a circuit board.

FIG. 2 is a side elevation view of the test clip of FIG. 1.

FIG. 3 is a sectional view of the test clip of FIG. 2.

FIG. 4 is a plan view of the test clip of FIG. 2.

FIG. 5 is an enlarged view of a portion of the test clip of FIG. 3, showing it engaged with an integrated circuit device.

FIG. 5A is a sectional view of a portion of the flat flexible cable assembly of FIG. 5.

FIG. 6 is an enlarged view of a portion of the test clip of FIG. 5, but without an integrated circuit device.

FIG. 7 is a partially sectional bottom view of the test clip of FIG. 2.

FIG. 8 is a partial isometric view of the flat flexible cable of FIG. 5.

FIG. 9 is a sectional isometric view of a portion of the test clip housing of FIG. 3.

FIG. 10 is a view of a portion of a test clip of FIG. 3, showing it in the process of engaging the integrated circuit device.

FIG. 11 is a view taken on the line 11—11 of FIG. 10, but showing only a portion of the test clip.

FIG. 12 is a view similar to that of FIG. 10, but with the test clip fully installed on the integrated circuit device.

FIG. 13 is a view similar to that of FIG. 11, but with the test clip fully installed on the integrated circuit device.

FIG. 14 is a rear view of a flat flexible cable assembly constructed in accordance with another embodiment of the invention.

DESCRIPTION OF THE PREFERRED EMBODIMENTS

Figure 6A:
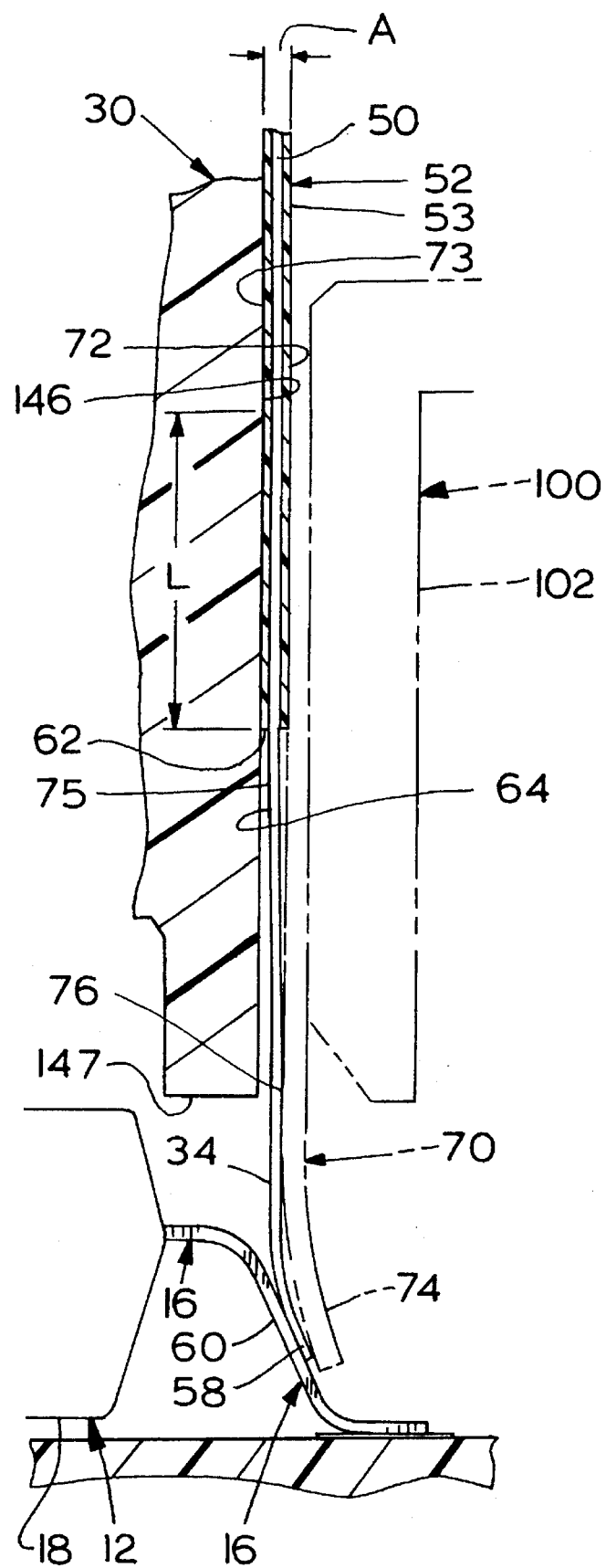
FIG. 6A is an enlarged view of a portion of FIG. 6.

FIG. 1 shows a test clip 10 of the present invention, which can be lowered onto a surface mounted IC (integrated circuit) device 12. The IC device has been mounted on an IC-holding circuit board device 14 of electronic equipment. The particular IC device is a CQFP (ceramic quad flat pack) IC device which includes fifty two leads 16 projecting horizontally from a body 18, including thirteen leads projecting from each of the four sides 21–24 of the body. As shown in FIG. 3, the test clip includes a clip housing 30 with locating walls 32 that engage the body of the IC device, to accurately locate the test clip with respect to the body of the IC device. The clip has a plurality of lead-engaging contacts 34 which engage the leads of the IC device. The lead-engaging contacts 34 are electrically coupled to an electrical connecting device formed by a header or connector 38, and specifically to connector contact elements 36 of the connector 38. The connector 38 lies on a test clip interconnect circuit board 40 which is, in turn, mounted on the clip housing 30.

As shown in FIG. 5, the lead-engaging contacts 34 are formed by the conductors 50 of a flat flexible cable 52. As shown in FIG. 5A, the cable 52 includes insulation 53 and a plurality of parallel conductors 50A, 50B, etc. embedded in the insulation. The insulation can be considered to comprise two layers 54, 56 between which the insulation is sandwiched (it is possible but not preferable to use one layer). The flexible insulation material of insulation 53 is thin and of low resilience, so that it and the copper conductors therein can be easily bent by a large angle and so they tend to retain the bend. Referring to FIG. 6A, the conductors 50 have lower ends 58 that serve as the lead-engaging contacts 34 to engage the leads 16 of the IC device 12. The leads 16 generally have horizontal top and bottom parts that are connected by a largely vertical part 60, and the cable conductor lower ends 58 engage the lead parts 60.

The insulation 53 of the flexible cable is terminated below the location 62 to leave the conductors 50 exposed below the location 62, although it is only necessary that the inner surfaces 64 of the conductors be exposed. As mentioned above, the copper conductors 50 are flexible but are not very resilient. Applicant applies a stiffener 70 to the outer side 72 of the flexible cable, with the stiffener having a lower portion 74 which backs up the lower ends 58 of the conductors. The stiffener 70 is formed of a sheet of resilient material which is stiffer than, and preferably more than twice as stiff, as the combined layers of insulation of the cable 52. That is, when the cable assembly, including the stiffener undergoes a given deflection such as 0.5 mm during engagement with a lead part, the assembly offers a resistance to such deflection which is more than three times the resistance offered in the absence of the stiffener. The stiffener resiliently resists bending, to press the conductor lower ends 58 firmly against the largely vertical parts 60 of the IC device leads 16.

A flat flexible cable is a device that includes a row of bendable conductors, with at least first end portions of the conductors extending parallel to each other and spaced apart along a row direction. Such a cable 52 also includes a sheet-like insulation, or insulator 53 of flexible material that is joined to the conductors 50 to hold them in position, with the conductors having surfaces lying in a common plane when the sheet-like insulator lies in substantially that common plane. The conductors usually have flat surfaces. The conductors 50 are integral, in that they do not include parts joined by solder or welding. The conductors 50 have unsupported portions 75 immediately below the location 62 where the insulation ends, and above the location 76 where the conductors directly engage the stiffening sheet or stiffener 70. The conductors are beams capable of supporting themselves independently of the insulation, unlike conductive ink traces that are used on some circuit boards.

It would be possible to construct the cable insulation 53 of thick highly resilient material, and to expose the lower ends of only the inner sides of the conductors. However, such highly resilient material might be difficult to handle in a highly bent condition, such as where it is bent to a 90° angle, and it is also possible that such highly resilient material would crack when maintained at such a sharp bend. Also, it is difficult to remove insulation on only one side of the conductors. Instead, applicant preferably removes insulation from around the entire lower ends of the conductor. If insulation remains on one side of the lower end, such insulation would tie adjacent conductor lower ends together so they could not deflect as independently, while adding only slight, if any, resilience. It would be possible to form long slots in the lower portions of the insulation between conductors, but for close spacing of the conductors this adds substantially to the cost. Applicant can use the bare conductors alone, or attach the stiffener to the cable as shown. It is desirable that each conductor lower end press against a lead part with a force of about fifty grams (where the leads are spaced 1 mm apart). The lower portion 74 of the cable extending below the hood-supported location, is of a height to supply 650 grams force after deflection to the position 74A, to supply the desired force for thirteen conductors.

The use of the flat flexible cable 52 (FIG. 5) facilitates connection of the cable conductors 50 to the contact elements 36 of the connector 38 that is mounted on the circuit board 40. The circuit board 40 is formed with a row of conductive pads 80 on its lower surface 82, the pads 80 being connected by means of plated-through holes 84 and conductive traces 86 on the upper surface 88 of the board to the contact elements 36. The flat cable 52 is bent by an angle of about 90° at 90, with the upper ends 92 of the conductors 50 also being exposed, at least at their upper surfaces. The upper ends 92 of the conductors press against the conductive pads 80 on the circuit board, and may be soldered thereto. Thus, the conductors of the flat cable 52 not only form the lead-engaging contacts 34, but also carry signals to the circuit board 40 on which the connector 38 is mounted.

The test clip housing 30 (FIG. 6A) includes a hood 100 with a lower portion 102 that lies against the outer surface of the stiffener 70 to "back it up" and maintain the stiffener 70 in a vertical plane. In this way, the hood and stiffener press against the cable outer surface 72 to press an opposite cable inner surface 73 against the rigid housing at its rigid flat vertical wall 146. The cable extends below the lower end 147 of the vertical wall 146. A length L of flexible cable (or cable locations spaced by distance L) where L is a plurality of times the cable thickness A and preferably at least five times its thickness, lies facewise against the substantially vertical rigid wall to fix the position and orientation of the cable and its conductors 50. The conductors 50 extend substantially vertically along the length L of flexible cable. If necessary, a screw with a flat end can be threaded in the hood 100 and press the stiffener 70 and cable portion L to press the cable against the flat wall. The hood also has an upper portion 104 (FIG. 5) that lies under and supports the circuit board 40 on the housing. The hood upper portion 104 supports the horizontal upper portion 106 of the cable and presses the cable conductor upper ends 92 against the conductive pads 80 on the circuit board. It is possible to rely solely on the pressure of the hood against the circuit board to assure electrical connection between the conductors and the conductive pads 80, although soldering can increase the reliability of the connection.

FIG. 3 shows that the clip housing 30 includes a center part 110 which comprises a base 112 of square cross section and a pair of panels 114, 116 mounted at opposite sides of the base. FIG. 9 shows a sectional view of the center portion 110, showing that it includes the rigid base 112 and the pair of panels 114, 116 mounted on the base. The base has two pairs of locating walls or legs 121–124 which locate the clip housing against two opposite sides of the IC device body. Each of the panels 114, 116 has a pair of locking fingers 131–134 which locate the test clip on two other opposite sides of the IC device body, and which also lock the test clip to the device body to resist removal of the test clip.

FIGS. 10 and 11 show the test clip 10 as it approaches a final position, with the locking finger at 132A being deflected from its initial orientation at 132 by the body 18 of the IC device. The finger at 132A is also guiding the test clip so the lower ends of the cable conductors (not shown in this figure) engage the largely vertical lead part 60 of the IC device. The locating legs such as 123 of the base of the housing central part, are also accurately positioning the test clip on the IC device. FIG. 12 shows the clip in the fully installed position, where the fingers such as 132 have deflected under a lower portion 18L of the IC device body to lock the clip in place. As shown in FIG. 3, the panels such as 114 are mounted on the base 112 by screws 140 at a location spaced considerably above the bottom of the panels. This allows the panels to flex, to allow the locking fingers such as 132 to readily deflect.

As shown in FIG. 9, the center portion 110 of the clip housing forms vertically extending edge portion such as 142, 144 which closely receive corresponding flexible cable assemblies such as assembly 150. Each assembly 150 includes the cable 52 with the stiffener 70 thereon. The width of the groove formed between the edge portions, in the direction parallel to the width of the cable 52, is slightly less than the width of the cable. The cable assembly can be installed by pressing it in place until the inner surface of the cable lies against a large area flat wall 146. The cable assembly 150 is trapped between the opposite side edges 142 of the groove which preferably have outer tips that are angled slightly toward each other. As shown in FIG. 6, the hood 100 has a lower portion 152 which lies closely around the cable assembly 150 to retain it in the center part 110 of the clip housing. The hood has a lower edge at 154 which can engage the stiffener 70, so that only the stiffener portion below the location 154 flexes outwardly.

As shown in FIG. 3, most of the clip parts are formed of plastic, with the metal parts comprising the conductors of the cable, the connector contact element 36, traces on the circuit board 40, and screws 160 of the circuit board. The parts are assembled by first forcing a metal insert 162 upwardly through a hole in the central part 110 of the housing up to the position shown. The circuit board 40 and hood 100 are placed in position and screws 160 installed. Finally, a handle 164 is installed by screwing it into the insert 162, the handle holding down the circuit board 40 and serving as the handle to hold and manipulate the test clip. In a test clip that applicant has constructed, for use with the IC device 12 which has thirteen leads on each of four sides spaced at a pitch of 1 mm, the overall width of the test clip was 4.3 cm, and the sizes of the other parts were as proportionately shown in FIG. 3.

As indicated in FIG. 7, the test clip has a vertical axis 170 and has first and second vertical center planes 172, 174, each extending through the vertical axis 170. Those parts whose surfaces face largely towards the axis 170 or towards a corresponding one of the center planes 172, 174 can be considered the inner surfaces, while those which face away can be considered the outer surfaces. The test clip is symmetrical about the plane 172 and is symmetrical about the plane 174, and includes four flat flexible cable assemblies. It should be noted that while terms such as "vertical", "horizontal", "upper,", "lower", etc. have been used herein to aid in the description of the invention, the test clip can be used in any orientation with respect to gravity.

FIG. 14 illustrates a portion of a modified stiffener 70X which has a lower portion 74X with multiple slots 75 dividing the lower portion into a plurality of fingers 77. The stiffener 70X is used in place of the stiffener 70 of FIG. 6, and is positioned so each stiffener finger 77 lies against one of the conductor lower ends 58. The modified stiffener 70X allows each conductor lower end to flex more easily, but requires precise placement of the stiffener on the cable.

Figure 15:
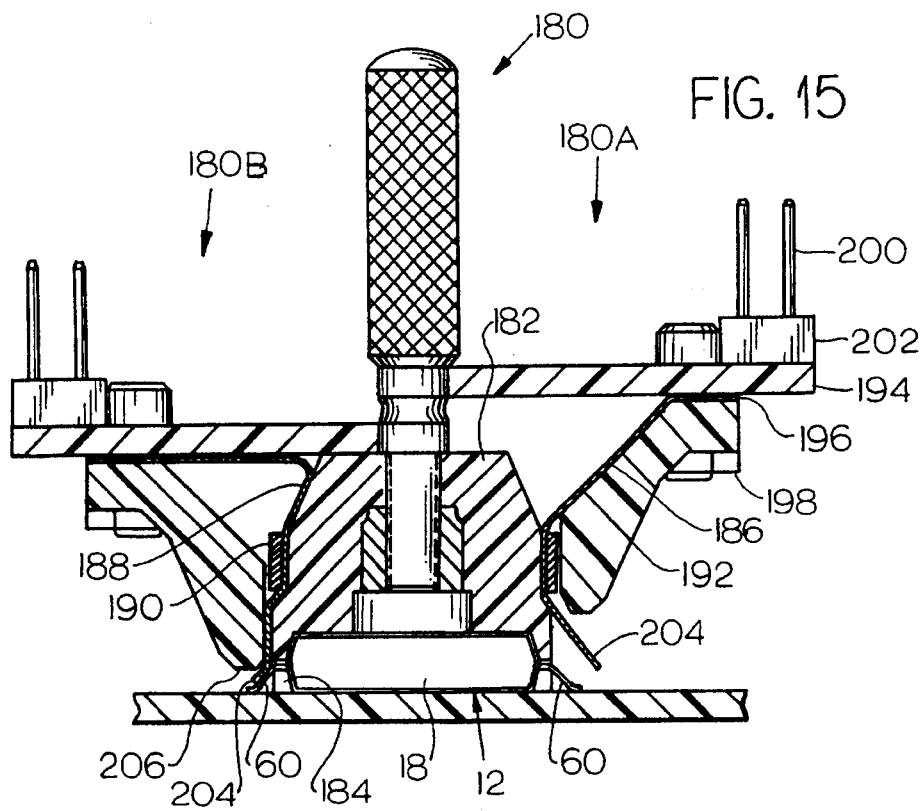
FIG. 15 is a sectional view of a test clip constructed in accordance with another embodiment of the invention, and shown in conjunction with an integrated circuit device, with the left half of the figure showing the test clip fully installed and the right half showing the test clip only partially installed.

FIG. 15 illustrates another test clip 180, with the right side of the figure showing the test clip at 180A in an open or upper position prior to full engagement with the IC device 12, and with the left side showing the clip at 180B in the fully engaged or closed position. The test clip includes a housing 182 with a lower portion having locating and locking walls that position the housing accurately on the body 18 of the IC device. Flat flexible cables such as 186, 188 have middle parts that are fixed to the housing by a ring 190. A hood device 192 is permanently attached to a circuit board assembly 194, and both are movable up and down. The cable has an upper end 196 which is trapped between an upper portion 198 of the hood device and the circuit board. The cable upper end has exposed conductors engaged with conductive traces on the lower surface of the circuit board assembly, which connect to contact elements 200 of a connector 202 on the circuit board. The cable has a lower end 204 where the conductors are exposed and preferably backed by a stiffener sheet, with the ring 190 and housing center bending the cable so the lower end 204 tends to extend away from the largely vertical lead part 60. When the hood is moved down as shown at 180B, a lower end 206 of the hood deflects the lower end 204 of the cable assembly against the lead part 60.

Figure 16:
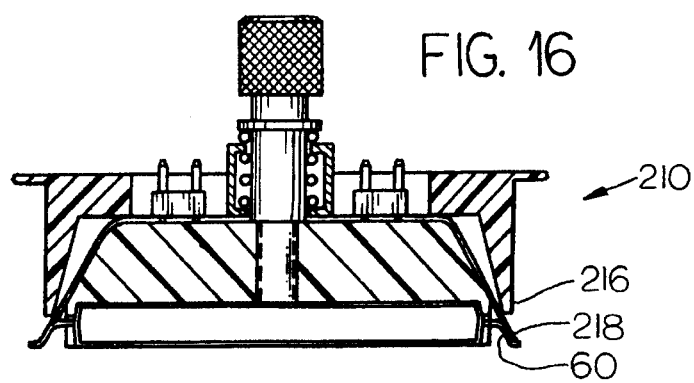
FIG. 16 is a sectional view of a test clip constructed in accordance with another embodiment of the invention in conjunction with an integrated circuit device, with the test clip fully installed.
Figure 17:
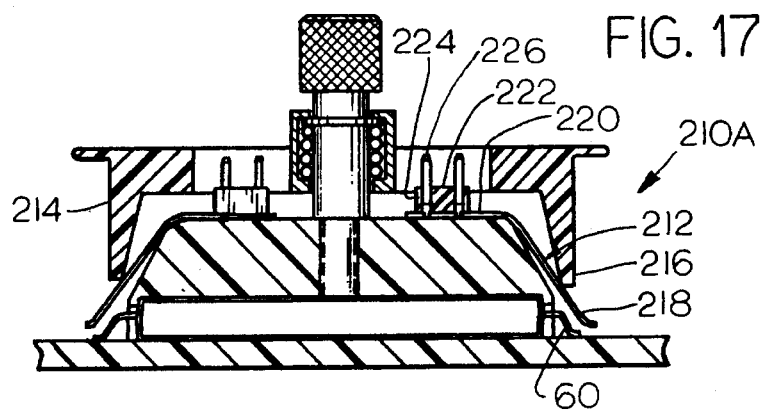
FIG. 17 is similar to that of FIG. 16, but with the test clip only partially installed on the integrated circuit device.

FIG. 17 shows another test clip 210 which is shown in the open position at 210A. Each flat flexible cable 212 includes a stiffener that urges it away from engagement with IC device lead parts 60, However, when a hood 214 is moved downwardly, as shown in FIG. 16, a lower part 216 of the hood deflects a lower part 218 of the cable assembly against the lead part 60. In this embodiment of the invention, the upper end 220 of the cable assembly 212 does not move with respect to a connector 222 to which it is connected. The insulative body 224 of the connector serves as an interconnect circuit board on which connector elements 226 are mounted which connect to the flat cable conductors.

Thus, the invention provides a test clip with contacts for engaging the leads extending from the sides of an integrated circuit device, which is of low cost and which can be more easily constructed to engage leads at a fine pitch such as 1 mm, 0.5 mm and less. This is accomplished by the use of a flat flexible cable which is mounted on the housing of the test clip and whose lower end includes conductors with at least their inner surfaces, and preferably their entire surface, exposed to directly contact the leads of the IC device to serve as contacts that engage the leads. While the cable includes insulation of flexible material, the resilience of the lower ends of the conductors can be enhanced by attaching a stiffener to the cable, with the stiffener being in the form of a resilient sheet lying on the outer side of the cable and preferably directly against the outer side of the conductor lower ends to resiliently resist deflection of the conductor lower ends. The cable is preferably bent so its upper end extends largely horizontally and the upper ends of the conductor lie horizontally against conductive pads on the lower surface of a circuit board. The test clip housing can be accurately positioned with respect to the body of the integrated circuit device by locating walls which engage the corners of the body. The corners can include locking fingers mounted on a separate panel, which can readily deflect by bending of the panel, to pass downwardly across the body of the IC device and position a bottom of the finger under the outside of the body.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. A test clip for testing an integrated circuit device (12) that has a body (18) and leads (16) extending from the body, comprising:

a clip housing (30) with locating walls (32) for closely engaging a circuit device body to locate said housing with respect to said circuit device body, said clip housing having a substantially vertical cable-supporting wall (146) that has a lower end (147);

a first device (38) mounted on said clip housing and having a plurality of contact elements (36):

a flat flexible cable (52) mounted on said clip housing, said cable having a flexible insulative material (53) and a plurality of conductors (50) embedded in said insulative material, said conductors having upper ends (92) electrically connected to said contact elements, said conductors having parallel lower ends (58) that are devoid of insulation to form exposed lead-engaging lower contact portions (34) to enable them to directly engage said leads, with the upper end and lead-engaging lower end portion of each conductor being integral;

said cable has an elongated located portion (L) with a first face (73) lying facewise against said substantially vertical cable-supporting wall with said conductors extending vertically therealong, and including a second device (100, 70) that presses against an opposite second face (72) of said cable elongated located portion to press said first face thereof against said cable-supporting wall, with said exposed lead-engaging lower end portions of said cable extending vertically down from said elongated located portion of said cable to a location below the lower end (147) of said cable-supporting wall.

2. The test clip described in claim 1 wherein:

said clip housing includes a center part with a lower end forming said locating walls that closely engage said circuit device body, said center part having at least one vertically extending surface with opposite sides and vertical edge portions projecting from said opposite sides, with said vertical edge portions spaced apart by slightly less than the width of said flat flexible cable, said cable having a lower portion lying against said vertically extending surface and trapped between said edge portions.

3. The test clip described in claim 1 including:

a stiffener comprising a sheet of resilient material which is stiffer than said cable flexible insulative material, said stiffener being attached to said cable and having a lower portion lying on a side of said conductor lower ends opposite said inner surfaces and biasing said conductor lower ends toward said lead parts.

4. The test clip described in claim 3 wherein:

said clip housing has a vertical axis and has a first imaginary center plane extending through said axis and extending parallel to said parallel conductors of said cable, as seen in a bottom view of said test clip;

said stiffener has an upper portion lying above said lower stiffener portion, and said clip housing includes a rigid hood that lies immediately outside said stiffener upper portion to prevent its deflection away from said first imaginary center plane, and which extends down to a location at the top of said stiffener lower portion, to allow outward deflection of a conductor lower end only by bending of said stiffener lower portion with respect to said stiffener upper portion.

5. The test clip described in claim 1 wherein:

said first device comprises an interconnect circuit board mounted on said clip housing to lie in a substantially horizontal plane thereon, said interconnect board having a lower face holding a row of contact pads, and including a connector mounted on said circuit board and having contact elements connected to said contact pads; and wherein said flexible cable tends to retain a bend, and is bent and has an upper end extending horizontally under said interconnect circuit board, with said conductors having upper surfaces exposed at said cable upper end and engaged with said contact pads;

said second device presses said cable upper end up substantially against said circuit board lower face.

6. A test clip for testing an integrated circuit device (12), of the type that has a body (18) with an upper portion of predetermined size and with opposite sides and with leads (16) extending from at least a first of said sides, with the leads having largely vertical lead parts (60), comprising:

a rigid clip housing (30) with a lower portion formed to engage and align itself with an integrated circuit body upper portion of predetermined size;

a cable (52) and an electrical connecting device (38) that are each mounted on said clip housing, said cable including a sheet-like insulator (53) and a row of conductors (50) embedded in said insulator to form a cable of predetermined thickness, said conductors having upper ends (92) electrically coupled to said electrical connecting device and having parallel primarily vertically-extending lower ends (58) spaced apart by the same spacing as said leads, with said conductor lower ends being integral with said conductor upper ends;

said lower ends of said conductors being free to be deflected and having exposed surfaces for directly engaging said leads;

said cable is fixed to said housing with said conductor lower ends being positioned to engage largely vertical lead parts of an integrated circuit as said clip is moved down onto said body;

said housing having a rigid flat substantially vertical locating wall (146), and including a device (100, 70) that presses a length (L) of said cable which is a plurality of times said thickness of said cable against said vertical locating wall, to fix the position and orientation of said cable relative to said locating wall, with said conductor lower ends extending vertically below said locating wall.

7. The test clip described in claim 6 wherein:

said lower ends of said conductors are free of said insulation all around each of said conductors.

8. The test clip described in claim 6 including:

a stiffener of resilient material which has an upper portion that is fixed in position with respect to said locating wall and which has a lower end that presses said conductor lower ends toward said leads.

* * * * *